United States Patent [19]

Boutigny

[11] Patent Number: 4,833,400
[45] Date of Patent: May 23, 1989

[54] HIGH FREQUENCY MULTI-RANGE ATTENUATOR HAVING A HIGH INPUT IMPEDANCE

[75] Inventor: Pierre-Henri Boutigny, Epinay-Sous-Senart, France

[73] Assignee: U.S. Philips Corp., New York, N.Y.

[21] Appl. No.: 24,655

[22] Filed: Mar. 11, 1987

[30] Foreign Application Priority Data

Mar. 14, 1986 [FR] France ................. 86 03680

[51] Int. Cl.$^4$ ............... H03F 3/68; G01R 13/22; G01R 15/08
[52] U.S. Cl. ............... 324/126; 324/72.5; 324/115; 324/121 R; 324/123 C; 330/51; 330/124 R; 330/125
[58] Field of Search ........... 324/121 R, 115, 126, 324/123 C, 123 R, 72.5; 330/9, 51, 294, 295, 279, 107, 124 R, 125; 333/81 R

[56] References Cited

U.S. PATENT DOCUMENTS

| 4,387,345 | 6/1983 | Kelley | 330/9 |
| 4,403,183 | 9/1983 | Lueker | 324/72.5 |
| 4,403,195 | 9/1983 | Wurzburg | 330/9 |
| 4,525,688 | 6/1985 | Murphy et al. | 333/81 R |
| 4,555,668 | 11/1985 | Gregorian et al. | 330/9 |
| 4,584,558 | 4/1986 | Maschek et al. | 340/347 AD |
| 4,598,252 | 7/1986 | Andrices | 330/51 |

Primary Examiner—Joseph Ruggiero
Assistant Examiner—Stephen M. Baker
Attorney, Agent, or Firm—Bernard Franzblau

[57] ABSTRACT

Attenuator having a high input impedance and several switching levels for high frequencies and oscilloscope and active probe comprising such an attenuator. A high frequency attenuator (15) having a high input impedance and several switching stages intended to attenuate a high-frequency electric signal introduced at an input terminal (10) of the attenuator. The attenuator supplies at a low-impedance output terminal (11) an output signal corresponding to the attenuated input signal. The attenuator comprises k broadband amplifiers $A_n$ ($1 \leq n \leq k$) having a very small input capacitance, capacitances $D_n$ arranged between each input and each output of each amplifier, and capacitances $C_n$ arranged between each input of each amplifier and the input terminal of the attenuator. The accurate attenuation switching levels are obtained by using different ratios $C_n/D_n$ to produce approximated switching levels which can be transformed to accurate switching levels by a low-impedance amplifier having a variable amplification. This attenuator may be used in oscilloscopes.

17 Claims, 4 Drawing Sheets

HIGH FREQUENCY MULTI-RANGE ATTENUATOR HAVING A HIGH INPUT IMPEDANCE

BACKGROUND OF THE INVENTION

This invention relates to an attenuator having a high input impedance and several switched levels and intended to attenuate a high-frequency electric signal introduced at an input terminal of the attenuator, the latter supplying at a low impedance output terminal an output signal corresponding to the attenuated input signal.

The invention further relates to an oscilloscope and an active probe for an oscilloscope comprising such an attenuator.

An attenuator of this kind is known from U.S. Pat. No. 4,525,688, which discloses an input circuit for an oscilloscope comprising an attenuator having a high input impedance and operating in a wide frequency band. Instruments, such as oscilloscopes, which have to carry out quantitative measurements of high accuracy, require the use of attenuation input circuits having a high input impedance so that the load impedance formed by attenuator and oscilloscope do not influence the source to be measured.

For this purpose, the aforementioned patent describes a controllable attenuator constituted by a cascade arrangement of dividers comprising resistors and capacitors and each constituted by a first parallel circuit $R_aC_a$ having fixed elements, by a second parallel circuit $R_bC_b$ whose capacitance $C_b$ is adjustable, by two adjustable capacitances $C_c$, $C_d$ and by two interruptors $S_a$ and $S_b$. The three adjustable capacitances $C_b$, $C_c$ and $C_d$ serve to control the frequency response and level responses of the attenuator. The two interruptors $S_a$ and $S_b$ are controlled so as to utilize or not to utilize the cell.

However, this attenuator has several disadvantages. The adjustments of the different capacitances which have to be effected for each level are numerous, can be carried out only with difficulty and are not very stable taking into account the accuracy of more than $10^{-2}$ required by the envisaged applications. These adjustments require expensive components. The interruptors $S_a$ and $S_b$ are arranged in the high-impedance part of the attenuator so that their high parasitic capacitances cause them to be poorly adapted to this application. Their dimensions in fact cannot be reduced sufficiently and this can lead to input capacitances of the attenuator that can amount to 10 to 20 pF.

SUMMARY OF THE INVENTION

An object of the invention is therefore to reduce the input capacitance of the attenuator by not using a mechanical switching system in the high-impedance part of the attenuator.

Another object of the invention is to avoid the numerous difficult adjustments to be effected by the designer and to offer to the user a more convenient and more reliable attenuator.

Therefore, the invention is characterized in that the attenuator comprises k broadband amplifiers $A_n$ ($1 \leq n \leq k$) having a very small input capacitance, capacitances $D_n$ arranged between each input and each output of each amplifier, capacitances $C_n$ arranged between each input of each amplifier and the input terminal of the attenuator, the value of the capacitance $C_n$ being obtained by dividing the value of the capacitance $C_{n-1}$ by a coefficient substantially equal to a value p, the ratios $R_n = C_n/D_n$ being suitable to form the coefficients of an attenuation range, k switches $I_n$, all the outputs of which are connected to the output terminal of the attenuator and each input of which is individually connected to the output of one of the amplifiers, the k switches providing a choice of one of the ratios of the attenuation range, the attenuator having a very small input capacitance.

It is further characterized in that this attenuator having a high input impedance for high frequencies and a small input capacitance can be associated with an input stage having a low impedance to form an attenuator having a high and a low input impedance and a small input capacitance. These attenuators can be used in the input stages of an oscilloscope or in an active probe for an oscilloscope.

According to the invention, the attenuator comprises several broadband amplifiers $A_n$ having a small input capacitance. Each amplifier is intended to cover a given attenuation range. Between the input and the output of the amplifier $A_n$ is arranged a capacitance $D_n$ of small value, of the order of the input capacitance of the amplifier itself. Each amplifier input is connected to the input terminal of the attenuator through a capacitance $C_n$. The output of each amplifier can be chosen by means of a switch $I_n$ connected to the output terminal of the attenuator. The capacitance $D_n$ have substantially the same value, for example 1 pF, and the capacitances $C_n$ are calibrated so as to form a range of coefficients corresponding to the application. Thus, the value of the capacitance $C_n$ is deduced from the value of the capacitance $C_{n-1}$ by dividing it by a coefficient p, for example equal to 10, $C_n = C_{n-1}/p$.

At the output of the amplifier $A_n$ is obtained an output signal which is attenuated in the ratio of the capacitances $C_n/D_n$. If, for the first amplifier $A_1$, $C_1$ is chosen to be equal to $D_1$, the output signal of the amplifier $A_1$ will be equal to the signal E applied to the input terminal of the attenuator, but supplied at low impedance. At the output of the amplifier $A_2$, the signal obtained will be equal to E/p, while at the output of the $n_{th}$ amplifier $A_n$, the signal obtained will be $E/p^n$. All these signals being at a low impedance, the coaxial selection switches $I_n$ adapted to the low impedances and arranged at the output do not cause disturbances in the attenuated signals. The outputs of all these switches $I_n$ are connected to each other and to the output terminal of the attenuator. Thus, not a single switching device is used in the high-voltage and high-impedance section of the attenuator for choosing an attenuation range. The very small capacitances $C_n$ used ensure that the resistance to overvoltages is readily obtained.

These attenuation levels are determined by the ratio of the capacitances $C_n/D_n$. It is possible to realize the assembly of the range of levels by using a number of amplifiers and a number of groups of capacitances $C_n/D_n$ equal to the number of levels present. However, in order to reduce the number of amplifiers and to ensure that accurately determined levels can more readily be obtained, it is preferable to provide only a few levels widely spaced apart and to complete the range by means of an amplifier having a variable amplification arranged behind the low-impedance section of the attenuator. The accuracy required for the switched levels of an oscilloscope being higher than $10^{-2}$, it is preferable to choose for the ratio $C_n/D_n$ an accuracy lower than $10^{-2}$ and to recover the accuracy of the range by means of the amplifier having a variable amplification. The output of the latter being at a low impedance, the intermediate switching levels are obtained by means of a low-voltage low-impedance attenuator.

In order for the attenuator to also operate at low impedance, for this purpose a switch in series with a resistor of low value is arranged between the input terminal of the attenuator and ground. Thus, an attenuator having a high and low impedance for high frequencies is obtained.

In order to process the low-frequency continuous signals, a resistive attenuator of the conventional type is arranged parallel to the attenuator having a high and low impedance.

This attenuator, adapted to high frequencies for operation at high impedance, as the case may be completed so as to operate at low impedance or to attenuate low-impedance or continous signals, is disposed in the input stage of an oscilloscope. However, in order to make it detachable and easy to utilize by a user, it is possible to dispose the high-impedance and high-frequency attenuator in a probe for an oscilloscope. The connections at high impedance are thus as short as possible, the connection with the oscilloscope being established by a low-impedance coaxial cable through a probe box arranged at the input of the oscilloscope, while the attenuation can be remotely controlled.

BRIEF DESCRIPTION OF THE DRAWINGS

In order that the invention may be readily carried out, it will now be described more fully, by way of example, with reference to the accompanying drawing, in which.

DESCRIPTION OF THE PREFERRED EMBODIMENTS

Figure 1:
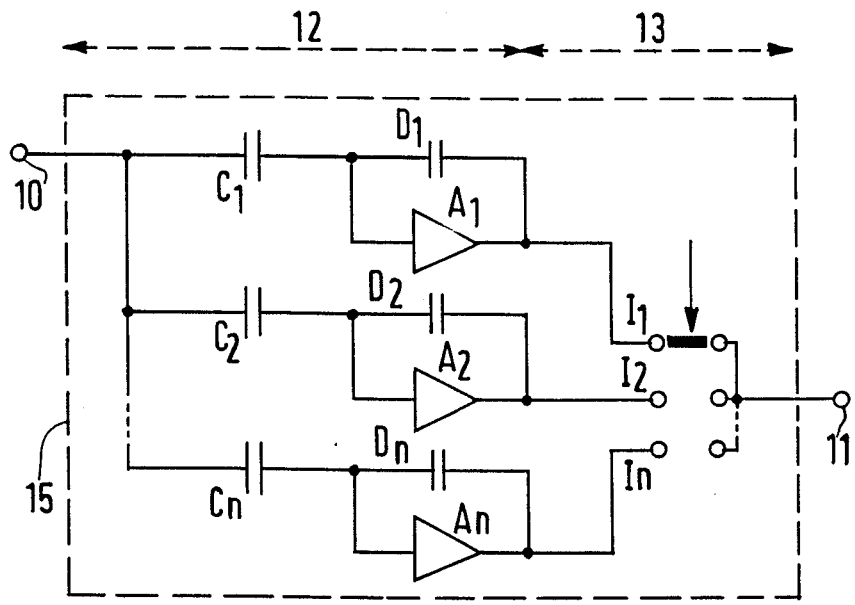
FIG. 1 shows an electric circuit diagram of an attenuator according to the invention having a high input impedance for high frequencies.

The electric circuit diagram of the attenuator 15 shown in FIG. 1 comprises n broadband amplifiers $A_1$ to $A_n$ provided between their inputs and their outputs with respective capacitances $D_1$ to $D_n$. Capacitances $C_1$ to $C_n$ are disposed between the input terminal 10 of the attenuator 15 and each amplifier input. The outputs of the amplifiers are connected individually to a first terminal of switches $I_1$ to $I_n$, of which all the second terminals are connected to the output terminal 11 of the attenuator. Preferably, the capacitances $D_1$ to $D_n$ have substantially the same value, for example 1 pF. The capacitance $C_1$ of the first amplifier is preferably equal to the capacitance $D_1$ so that the signal at the output of the amplifier corresponds to the signal applied to the terminal 10, but attenuated by a ratio $p = C_1/D_1$ equal to 1, but supplied at a low impedance.

The values of the capacitances $C_2$ to $C_n$ are determined so as to obtain the desired attenuation range corresponding to the ratios $C_n/D_n$.

The signals at the outputs of the amplifiers can be chosen by means of the switches $I_1$ to $I_n$.

The amplifiers $A_1$ to $A_n$ have a high input impedance and a small input capacitance so that the attenuator has a high impedance for the signal applied to the terminal 10. On the contrary, because of the capacitive arrangement of each amplifier these amplifiers have a low output impedance, which permits the use of coaxial switches $I_n$ having a low impedance, for example 50Ω. The zone 12 is the zone of high impedance and high voltage and the zone 13 is the zone of low impedance and low voltage.

In the example chosen for realizing the three attenuation ranges, for example, 1/1, 1/10, 1/100, it is necessary to give the capacitances $C_1$, $C_2$ and $C_3$ the values 1 pF, 0.1 pF and 0.01 pF, respectively, with $D_1 = D_2 = D_3 = 1$ pF.

Figure 2:
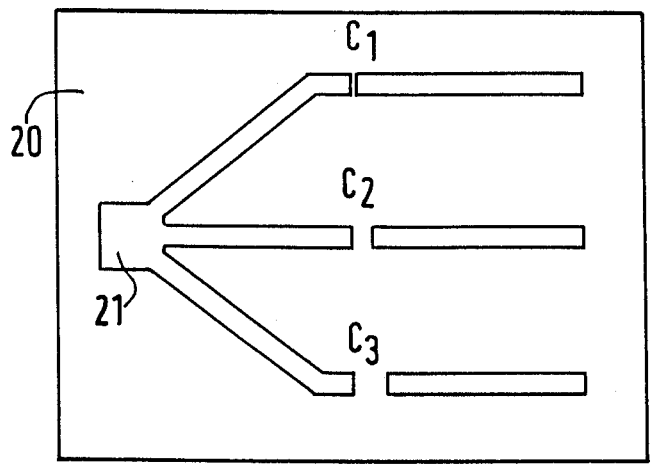
FIG. 2 shows a representation of the realization of the capacitances $C_n$ by means of a conductive layer on a substrate.

The capacitances, more particularly $C_1$, $C_2$, $C_3$, must have very low values. They are obtained by realizing the capacitances for example according to the representation of FIG. 2.

On a support 20 are formed coplanar conductive layers having, for example, the form of long limbs. Each layer has a discontinuity so that the two ends arranged opposite to each other constitute a capacitance. The width of the discontinuity and the cross-section of the interrupted conductors determine the value of the capacitances. In the example chosen, the capacitances $C_1 = 1$ pF, $C_2 = 0.1$ pF and $C_3 = 0.01$ pF are thus obtained. They all have a junction point 21 intended to be connected to the input terminal of the attenuator. The other point of each capacitance is connected to the input of their respective amplifier.

It is possible to realize the capacitance by other methods, but in most cases it is not necessary to set a limit in that values of capacitances are obtained having the usual tolerance of $10^{-2}$ necessary to realize a correct attenuation range for an oscilloscope.

Figure 3:
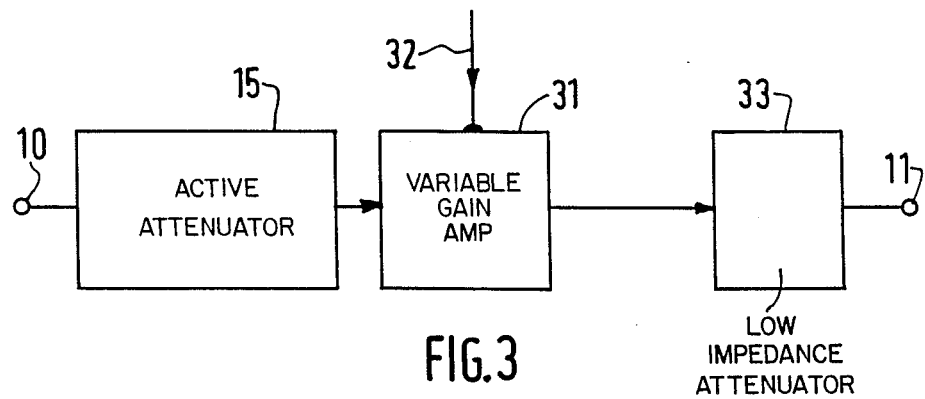
FIG. 3 shows a circuit diagram of the attenuator of the kind shown in FIG. 1 followed by an amplifier having a variable amplification.

Preferably, the invention utilizes approximated capacitance values and provides for the accuracy required by means of an amplifier 31 having a variable amplification, as shown in FIG. 3. The preceding active attenuator 15 provides switched levels near, for example, 1, 1/10, 1/100. Its output is applied to the amplifier 31 having a variable amplification, which has an input 32, at which a control signal is introduced which is intended to program the amplifications of the amplifier 31 so that the overall attenuation exactly corresponds to the desired values. This amplifier is arranged behind the zone of low impedance of the attenuator 15, which permits of correctly obtaining the switching levels for the whole range of high frequencies considered.

By means of a low-voltage and low-impedance attenuator 33 arranged behind the amplfier 31, the intermediate attenuation ratios, for example 1/1, 1/2, 1/5, are obtained to cover the ranges conventionally used in oscilloscopes. The control signal applied to the input 32 renders it possible not only for the designer, but also for the user to carry out the adjustments. The adjustment of such an attenuator necessitates simply 3 direct voltage adjustments necessary for the control of the variable gain amplifier in the three positions 1/1, 1/10 and 1/100.

This is without a doubt much simpler and much more reliable than the previous solutions, which could in practice be realized only by the designer.

The attenuator shown in FIG. 3 has a high input impedance for high frequencies. However, it is generally efficient to use for high frequencies an attenuator having a low imput impedance and a small input capacitance.

Figure 4:
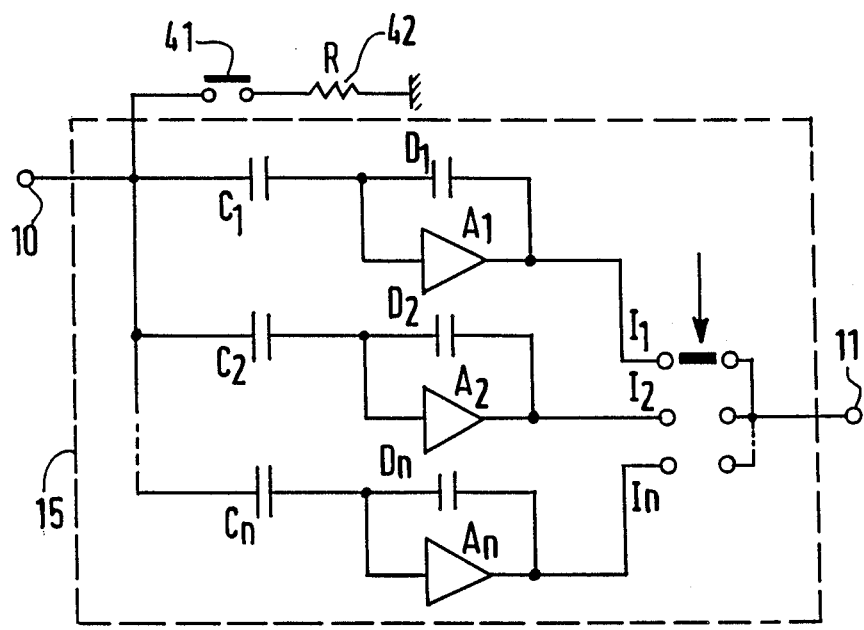
FIG. 4 shows a circuit diagram of the attenuator shown in FIG. 1 further comprising low-impedance adaptation means.

Therefore, the electric circuit diagram of FIG. 4 represents an attenuator which renders it possible for the user to choose between a high and a low input impedance. It is constituted by the attenuator 15 having a high input impedance, to whose input terminal is connected a switch 41 having a low impedance, which is, for example, coaxial, and a resistor R42 of low value connected to ground. This resistor has, for example a value of 50Ω, as is usual in an oscilloscope.

Figure 5:
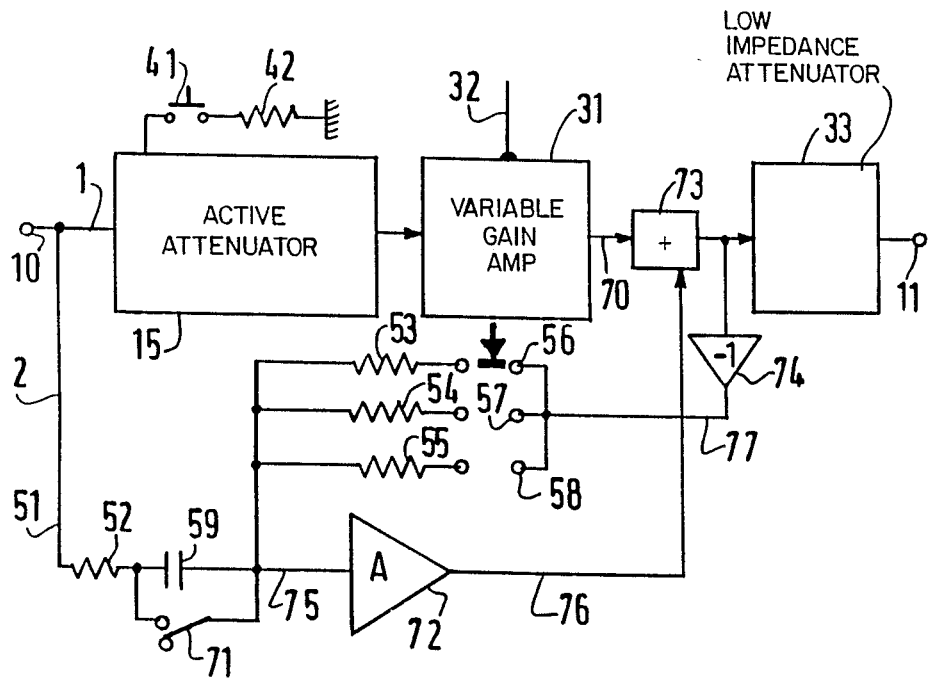
FIG. 5 shows a circuit diagram of the attenuator having a high and a low impedance for high and low frequencies for an oscilloscope.

In order that high-frequency signals on the one hand and low-frequency signals or continuous signals on the other hand can be processed, the attenuator shown in FIG. 5 is used.

The low-frequency and continuous signals are orientated with respect to a branch 51 which comprises a resistive divider bridge constituted by a head resistor 52 and by bridge resistors, for example 53, 54, 55 through three switching levels. With resistors 52, 53, 54, 55 having values of 1MΩ, 1MΩ, 100 kΩ and 10 kΩ, respectively, the situation shown in FIG. 5 corresponds to the three same switching levels as above, i.e. 1/1, 1/10, and 1/100. They can be selected by switches 56, 57,58. The accuracy of the resistors is sufficient to avoid any adjustment. At low frequencies, the signal applied passes through a capacitance 59, which can be short-circuited by a switch 71 to operate with continuous signals in order to realize the two necessary coupling modes, i.e. the "alternating"and the "continuous" mode.

The capacitance is arranged between the head resistor 52 and a junction point of the bridge resistors 53, 54, 55. The junction point is connected to the input of an operational amplifier 72. The latter supplies a signal which is processed by an addition circuit 73 so as to form a signal in accordance with the input signal, but attenuated according to the chosen switched levels. The switches 56, 57 and 58 and the switches $I_n$ of the attenuator 15 operate synchronously. The output of the addition circuit 73 enters an amplifier 74 having a negative amplification, whose output is connected to the junction point of the switches 56, 57, 58. The loop thus formed by the series arrangement of the amplifier 72, of the addition circuit 73, of the amplifier 74 having a negative amplification, and of one of the switches 56, 57, 58 associated with one of the resistors 53, 54 and 55, respectively, permits of adjusting the attenuation of the low impedance part to that of the high-impedance part. The output of the addition circuit enters the low-voltage and low-impedance attenuator 33, which determines the intermediate switching levels.

The operation of the circuit of FIG. 5 is analysed in the following manner. Let it be assumed that Ve is the signal present at the terminal 10 and that Vs is that at the connection 70 originating from the path 1. The attenuator 15 and the amplifier 31 constitute a high-frequency attenuator. The output voltage Vs of such an attenuator is written as:

$$Vs = -K \frac{s \, \tau_H}{1 + s \cdot \tau_H} Ve$$

with

K: attenuation ratio 1, 1/10, 1/100, $\tau_H$: such that the inverse of $\tau_H$ is equal to the low cut-off frequency of the HF attenuator, s: symbolic calculation element.

On the other hand, the operational amplifier 72 has an amplification G and a high cut-off frequency. When it is assumed that:

$\epsilon$ is the signal at the connection 75 at the input of the amplifier 72,

X is the signal at the connection 76 at the output of the amplifier 72, $G_H$ is the amplification of the high-frequency path 1, the following relations can be written:

$$Vs = -G_H \cdot Ve \tag{1}$$

$$\epsilon = K/(1+K)Ve - S/(1+K) \tag{2}$$

$$X = -G_B \cdot \epsilon \tag{3}$$

$$S = -Vs - X. \tag{4}$$

These relations permit of obtaining the following relation:

$$\frac{S}{Ve} = \frac{G_H + \frac{K}{1+K} \cdot G_B}{1 + \frac{G_B}{1+K}} \tag{5}$$

The amplification $G_H$ of the HF path 1 is now:

$G_H = K \cdot g_H$, where $g_H$ is the amplification of one of the amplifiers $A_1$ to $A_n$, with $g_H = 1$ when the frequency becomes very high.

The relation (5) is written as:

$$\frac{S}{Ve} = K \left[ 1 + \frac{g_H - 1}{1 + \frac{1}{1 + K^{G_B}}} \right] \tag{6}$$

The global attenuation of the stage consequently comprises a factor K corresponding to the broadband attenuation added to the parasitic factor:

$$K \cdot \frac{g_H - 1}{1 + \frac{1}{1+K} \cdot G_B} \tag{7}$$

This factor therefore has to be minimized over the whole frequency band to obtain a constant amplification equal to K.

With respect to the frequency responses there can be written:

$$g_H = \frac{s \cdot \tau_H}{1 + s \tau_B} \text{ for the } HF \text{ attenuator}$$

and $$G_B = \frac{g_o}{1 + s \tau_B}$$

for the operational amplifier $A_n$, where $g_o \gg 1$.

The numerator of the parasitic factor (7) is written as:

$$g_H - 1 = \frac{-1}{1 + s\tau_H}$$

and the denominator 1 is written as:

$$1 + \frac{1}{1+K} G_B = \frac{(1+K)(1+s\tau_B) + G_o}{(1+K)(1+s\tau_B)}$$

Figure 6:
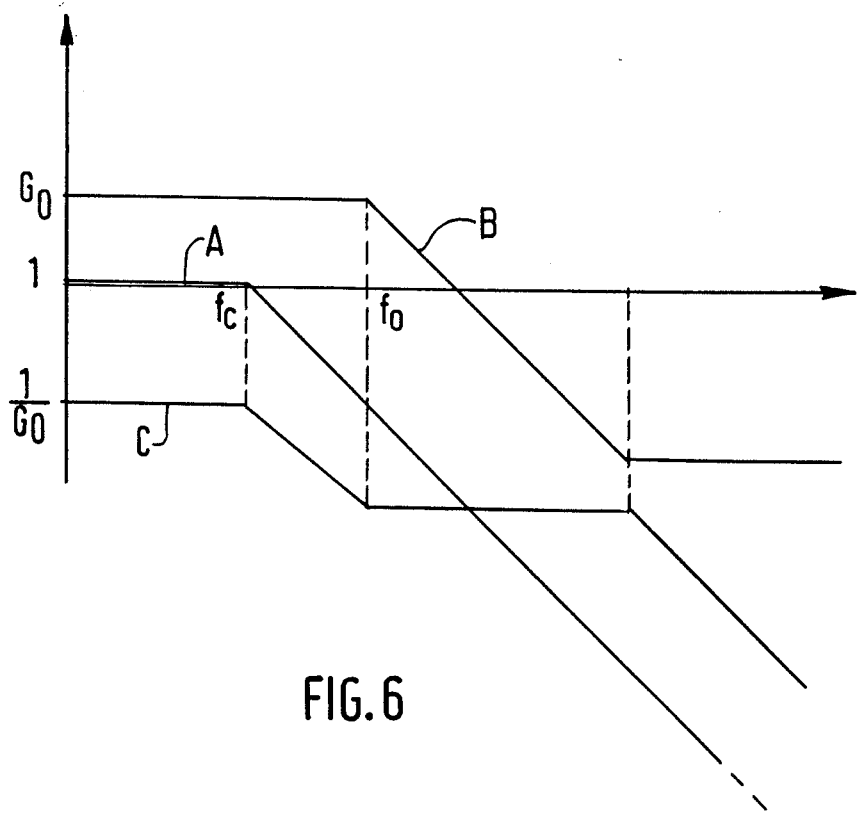
FIG. 6 shows a diagrammatic representation of the variations of the amplification with frequency for signals in the circuit of FIG. 5.

The curve A of FIG. 6 shows the evolution of the amplification with respect to the numerator with a cut-off frequency $f_c = 1/2\pi\tau_H$ from which the amplification continuously decreases.

Likewise, the curve B represents the evolution of the amplification with respect to the denominator with a low cut-off frequency $f_o = 1/2\pi(1+K)\tau_B$ and a high cut-off frequency of $(1+K+G_o)f_o$.

The variations of the parasitic factor represented by the equation (7) are shown on the curve C. This factor has to remain as small as possible and must not exhibit an increase over the whole frequency band. Therefore, it is necessary that the cut-off frequency $f_c$ be lower than the cut-off frequency $f_o$. If this should not be taken into account, the curve C would have a positive inclination in FIG. 6 between $f_c$ and $f_o$ followed by a step, which will not permit of having a constant attenuation equal to K over the whole band. It is also necessary that the high frequency $(1+K+G_o)f_o$ be much higher than $f_c$. This means that the product amplification-band $G_o.f_o$ of the operational amplifier 72 is much larger than the low cut-off frequency of the high-frequency amplifier of the path 1.

Thus, by way of example, with a high-frequency amplifier having a pass band of 1 kHz to 2 GHz, it is necessary that the product amplification-band of the operational amplifier is of the order of 100 kHz.

Figure 7:
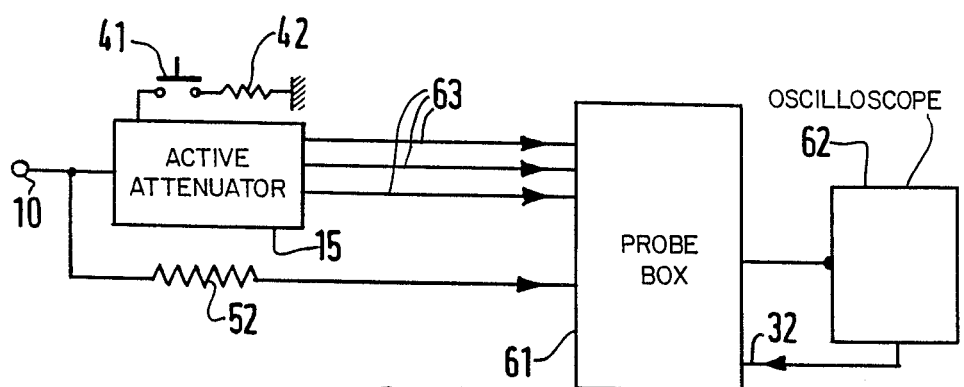
FIG. 7 shows an electric circuit diagram of a probe for an oscilloscope.

Such an attenuator operating at a high and a low input impedance for signals at high and/or at low frequencies according to the electric circuit diagrams of FIGS. 1, 3, 4 or 5 can be used in the input stages of electrical equipment, more particularly measuring equipment, such as oscilloscopes. In the latter case, it is generally desirable to use a detachable apparatus in the form of an active probe for an oscilloscope. The separation existing in the attenuator according to the invention between a zone at high voltage and high impedance and a zone at low voltage and low impedance permits of using an active probe for which the high-frequency connections to the oscilloscope are obtained at low impedance. The electric circuit diagram of such a probe is shown in FIG. 7. The electric signal flows through the input terminal 10 into the attenuator 15 having a high input impedance for high frequencies. It may be provided with the switch 41 and with the resistor of low value 42 to operate at low impedance. However, the latter arrangement is not absolutely necessary. The signals selected by the switches $I_n$ are transferred by means of coaxial cables 63, for example of 50Ω, to a probe box 61, which can be fixed on the input plug of an oscilloscope 62. There is one coaxial connection per switching level. The low-frequency signals are transferred separately by means of a low-frequency connection through the resistor 52. The attenuation ratios can be remotely controlled from the control board of the oscilloscope which transmits control signals to the input 32 of the amplifier having a variable amplification. The high-impedance attenuator 15 can thus be arranged in the nipple of the active probe and can form a probe of very small dimensions, the low-impedance switching elements being accommodated in a probe box contiguous to the oscilloscope.

What is claimed is:

1. An attenuator having a high input impedance and several switched levels intended to attenuate a high-frequency electric signal introduced at an input terminal of the attenuator, the attenuator supplying at a low impedance output terminal an output signal corresponding to the attenuated input signal, characterized in that the attenuator comprises k broadband amplifiers $A_n$ ($1 \leq n \leq k$) having a very small input capacitance capacitances $D_n$ connected between each input and each output of each amplifier, capacitances $C_n$ connected between each input of each amplifier and the input terminal of the attenuator, the value of the capacitance $C_n$ being obtained by dividing the value of the capacitance $C_{n-1}$ by a coefficient substantially equal to a value p, the ratios $R_n = C_n/D_n$ being suitable to form the coefficients of an attenuation range, and k switches $I_n$, all the outputs of which are connected to the output terminal of the attenuator and each input of which is individually connected to the output of one of the amplifiers, the k switches permitting of choosing one of the ratios of the attenuation range, the attenuator having a very small input capacitance.

2. An attenuator as claimed in claim 1, characterized in that the capacitances $D_n$ all have substantially the same value $C_o$.

3. An attenuator as claimed in claim 2 further comprising a further broad band amplifier having a variable amplification externally controllable, said further broad band amplifier being connected to a common terminal of said switches.

4. An attenuator for operation at a high or low input impedance comprising an attenuator as claimed in claim 2 having a high input impedance, and a further switch connected in series with a low resistance resistor R between said input terminal and ground.

5. An attenuator as claimed in claim 2, characterized in that the capacitance $C_1$ is substantially equal to $C_O$ and in that the value p is substantially equal to 10.

6. An attenuator as claimed in claim 1, characterized in that each capacitance $C_n$ comprises two conductors whose relative proximity determines the value of each capacitance $C_n$.

7. An attenuator as claimed in claim 6, characterized in that each capacitance $C_n$ comprises two coplanar conductors formed from a conducting strip deposited on a substrate which is interrupted over a distance determining the value of the capacitance $C_n$.

8. An attenuator as claimed in claim 1, further comprising a variable gain broadband amplifier externally controlled and connected to a common output terminal of the k switches $I_n$.

9. An attenuator for operation at a high or low input impedance comprising: an attenuator having a high input impedance as claimed in claim 1, and a further switch connected in series with a resistor R of low value between said input terminal and ground.

10. An attenuator as claimed in claim 9, characterized in that the resistor R is equal to 50Ω.

11. An attenuator as claimed in claim 1, wherein the capacitances $D_n$ and $C_n$ and the amplifiers $A_n$ are chosen to produce a low output impedance at each amplifier output, and wherein said switches $I_n$ are low impedance switches having impedance values approximately equal to said output impedances of the amplifiers, whereby said attenuator exhibits a high input impedance at said attenuator input terminal and a low input impedance at the attenuator output terminal.

12. An attenuator as claimed in claim 1, wherein the capacitances $D_n$ and $C_n$ and the amplifiers $A_n$ are chosen to produce a very low input capacitance at said attenuator input terminal and a low output impedance at each said amplifier output.

13. A attenuator as claimed in claim 1, further comprising a variable gain amplifier and a low voltage low impedance attenuator connected in cascade between a common output of said switches $I_n$ and said attenuator output terminal, said variable gain amplifier having a control input providing external adjustment of its gain so as to produce a fine adjustment of one or more ranges of the attenuator.

14. An active attenuator probe for connection to a signal input of a wide band oscilloscope comprising: an input terminal for a high frequency signal to be measured by the oscilloscope, a low impedance output terminal for connection to said oscilloscope signal input, a plurality of broad band amplifiers each having a high input impedance and a very small input capacitance, each amplifier having a capacitor $D_n$ connected between the input and output of the amplifier, a plurality of small capacitors $C_n$ connected between respective amplifier inputs and said attenuator input terminal whereby said attenuator input terminal presents a high input impedance and a low input capacitance to signals applied thereto, said amplifier-capacitor combinations each providing a low output impedance at each amplifier output, the capacitors being chosen so that the ratios $R_n = C_n/D_n$ of each amplifier $C_n$-$D_n$ capacitor combination provide a series of attenuation ranges for an input signal applied to the attenuator input terminal, and a low impedance switching means having inputs connected individually to respective outputs of said amplifiers and a common output coupled to said attenuator output terminal to selectively couple an input signal from the input terminal to the output terminal via a selected amplifier thereby providing range selection, said attenuator output terminal providing a low output impedance.

15. An oscilloscope comprising:
input means for an electric signal, and an attenuator having a high input impedance and several switched levels in order to attenuate a high-frequency electric signal introduced at an input terminal of the attenuator, wherein the attenuator comprises:

a low impedance low-frequency output terminal coupled to said input means for supplying an output signal coresponding to the attenuated input signal, k broadband amplifiers $A_n$ ($1 \leq n \leq k$) having a very small input capacitance, capacitances $D_n$ connected between each input and each output of each amplifier, capacitances $C_n$ connected between each input of each amplifier and the input terminal of the attenuator, wherein each capacitance $C_n$ is equal to the capacitance $C_{n-1}$, and oscilloscope display means connected to the output terminal divided by a coefficient substantially equal to a value p, the ratios $R_n = C_n/D_n$ being suitable to form the coefficients of an attenuation range, and k switches $I_n$ having outputs connected to the output terminal of the attenuator and each input of which is individually connected to the output of one of the amplifiers, the k switches providing a choice of different ones of the ratios of the attenuation range, the attenuator having a very small input capacitance.

16. An active probe for an oscilloscope comprising:
an attenuator having a high input impedance and several switched levels adapted to attenuate a high-frequency electrical signal introduced at an input terminal of the attenuator, means for coupling output signals of the attenuator to an input of an oscilloscope, and wherein said attenuator comprises:

a low impedance output terminal for supplying an output signal corresponding to the attenuated input signal, k broadband amplifiers $A_n$ ($1 \leq n \leq k$) having a very small input capacitance, capacitances $D_n$ connected between each input and each output of each amplifier, capacitances $C_n$ connected between each input of each amplifier and the input terminal of the attenuator, wherein each capacitance $C_n$ is equal to the capacitance $C_{n-1}$ divided by a coefficient substantially equal to a value p, the ratios $R_n = C_n/D_n$ being suitable to form the coefficients of an attenuation range, and k switches $I_n$ having outputs connected to the output terminal of the attenuator and each input of which is individually connected to the output of one of the amplifiers, the k switches providing a choice of different ones of the ratios of the attenuation range, the attenuator having a very small input capacitance.

17. An active probe as claimed in claim 16, characterized in that said signal coupling means comprises a probe box and the output terminal of the high frequency high impedance attenuator provides a low impedance output connected via low-impedance connections to the probe box which is connectable to said input of the oscilloscope.

* * * * *